(12) United States Patent
Kang et al.

(10) Patent No.: US 8,487,310 B2
(45) Date of Patent: Jul. 16, 2013

(54) ORGANIC LIGHT-EMITTING DISPLAY APPARATUS

(75) Inventors: Jin-Goo Kang, Yongin (KR); Ji-Young Kim, Yongin (KR); Hyo-Seok Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/098,046

(22) Filed: Apr. 29, 2011

(65) Prior Publication Data

US 2012/0097952 A1     Apr. 26, 2012

(30) Foreign Application Priority Data

Oct. 26, 2010    (KR) ................. 10-2010-0104742

(51) Int. Cl.
*H01L 27/12*       (2006.01)
*H01L 27/32*       (2006.01)
*H01L 51/52*       (2006.01)

(52) U.S. Cl.
USPC ................. 257/59; 257/72; 257/E29.273

(58) Field of Classification Search
None
See application file for complete search history.

(56) References Cited

U.S. PATENT DOCUMENTS

| | | | |
|---|---|---|---|
| 2005/0116617 A1* | 6/2005 | Lee et al. | 313/500 |
| 2006/0097264 A1* | 5/2006 | Kim et al. | 257/72 |
| 2006/0125390 A1 | 6/2006 | Oh | |
| 2007/0031641 A1* | 2/2007 | Frisch et al. | 428/172 |
| 2007/0046186 A1* | 3/2007 | Kim | 313/504 |
| 2007/0200496 A1* | 8/2007 | Cok et al. | 313/512 |
| 2008/0012472 A1 | 1/2008 | Uchida | |
| 2010/0007271 A1* | 1/2010 | Lee et al. | 313/504 |

FOREIGN PATENT DOCUMENTS

| | | |
|---|---|---|
| JP | 2010-118253 | 5/2010 |
| KR | 10-2004-0000629 | 1/2004 |
| KR | 2004000629 A * | 7/2004 |
| KR | 10-2006-0067049 | 6/2006 |
| KR | 10-2007-0079303 | 8/2007 |
| KR | 10-2009-0021443 | 3/2009 |

OTHER PUBLICATIONS

Lemmi, F., W. Chung, S. Lin, P.M. Smith, T. Sasagawa, B.C. Drews, A. Hua, J.R. Stern, and J.Y. Chen. "High-Performance TFTs Fabricated on Plastic Substrates." IEEE Electron Device Letters 25.7 (2004): 486-88.*

* cited by examiner

*Primary Examiner* — Thomas L Dickey
*Assistant Examiner* — Joseph Schoenholtz
(74) *Attorney, Agent, or Firm* — Robert E. Bushnell, Esq

(57) ABSTRACT

An organic light-emitting display apparatus comprises: a substrate in which a pixel region is defined; a thin film transistor (TFT) disposed on the substrate and spaced apart from the pixel region; a planarization pattern covering the TFT and spaced apart from the pixel region; a first electrode electrically connected to the TFT and formed so as to correspond to at least the pixel region; a pixel-defining layer formed on the first electrode so as to expose a predetermined region of the first electrode; an intermediate layer connected to the exposed region of the first electrode, including an organic emission layer, and formed to correspond to at least the pixel region; and a second electrode electrically connected to the intermediate layer.

20 Claims, 1 Drawing Sheet

ORGANIC LIGHT-EMITTING DISPLAY APPARATUS

CLAIM OF PRIORITY

This application makes reference to, incorporates the same herein, and claims all benefits accruing under 35 U.S.C. §119 from an application earlier filed in the Korean Intellectual Property Office on Oct. 26, 2010 and there duly assigned Serial No. 10-2010-0104742.

BACKGROUND OF THE INVENTION

1. Field of the Invention

The present invention relates to an organic light-emitting display apparatus, and more particularly, to an organic light-emitting display apparatus capable of improving image quality.

2. Description of the Related Art

Recent display apparatuses tend to be replaced by thin portable flat panel display apparatuses. Organic electroluminescent display devices, as one of the self-emitting display devices from among flat panel display apparatuses, have drawn attention as next generation display devices due to advantages such as wide viewing angle, a good contrast, and fast response speeds.

An organic light-emitting display apparatus includes an organic light-emitting device having first and second electrodes. An intermediate layer includes an organic emission layer. When a voltage is applied to the first and second electrodes, the organic emission layer emits visible light.

A portion of the visible light emitted from the organic emission layer becomes extinct while sequentially passing through the first or second electrode and the other members, such as an insulating layer, a polarization layer, etc. Accordingly, the luminescent efficiency of organic light-emitting display apparatuses is decreased from the viewpoint of users, and thus there is a limit in improving the image quality of the organic light-emitting display apparatuses.

SUMMARY OF THE INVENTION

The present invention provides an organic light-emitting display apparatus in which image quality can be easily improved.

According to an aspect of the present invention, there is provided an organic light-emitting display apparatus comprising: a substrate in which a pixel region is defined; a thin film transistor (TFT) disposed on the substrate so as to be spaced apart from the pixel region; a planarization pattern covering the TFT and formed so as to be spaced apart from the pixel region; a first electrode electrically connected to the TFT and formed so as to correspond to at least the pixel region; a pixel-defining layer formed on the first electrode so as to expose a predetermined region of the first electrode; an intermediate layer connected to the exposed region of the first electrode, including an organic emission layer, and formed so as to correspond to at least the pixel region; and a second electrode electrically connected to the intermediate layer.

The TFT may include an active layer, a gate electrode insulated from the active layer, a source electrode, and a drain electrode, and the first electrode is connected to the drain electrode.

A gate insulating film may be disposed between the active layer and the gate electrode, and an interlayer insulating film is disposed between the gate electrode and the source electrode and between the gate electrode and the drain electrode.

In addition, the gate insulating film and the interlayer insulating film are covered by a planarization pattern within an area where the planarization pattern is formed.

An outer surface of the gate insulating film and an outer surface of the interlayer insulating film may be disposed on the same plane.

The pixel-defining layer may include projecting portions formed around the pixel region.

The projecting portion may project in a direction perpendicular to a thickness direction of the substrate.

The intermediate layer may contact side surfaces of the projecting portions.

The projecting portion may project toward the pixel region from a side of the planarization pattern.

The pixel-defining layer may be formed thinner than the planarization pattern.

The organic light-emitting display apparatus may further include an optical resonance insulating layer formed between the substrate and the first electrode in at least the pixel region.

The optical resonance insulating layer may be formed on the entire substrate.

The optical resonance insulating layer may have a structure in which a plurality of insulating layers are stacked.

The optical resonance insulating layer may have a structure in which a layer including $SiO_2$ and a layer including $SiN_x$ are alternately stacked at least once.

The first electrode may be formed on the planarization pattern and include openings through which the planarization pattern is exposed.

The intermediate layer may be formed by using a printing method.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Hereinafter, exemplary embodiments of the present invention will be described in detail with reference to the accompanying drawings.

Figure 1:
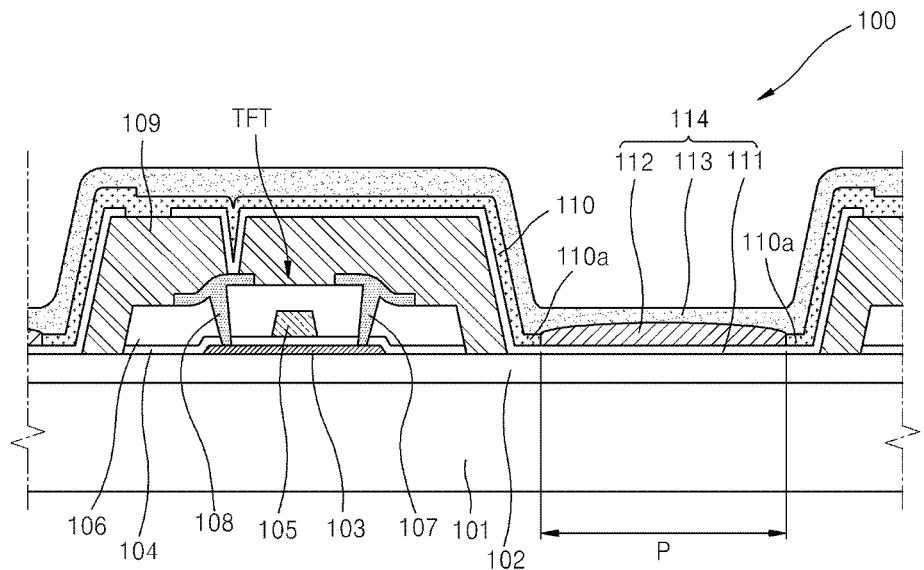
FIG. 1 is a schematic cross-sectional view of an organic light-emitting display apparatus according to an embodiment of the present invention.

FIG. 1 is a schematic cross-sectional view of an organic light-emitting display apparatus according to an embodiment of the present invention.

Referring to FIG. 1, the organic light-emitting display apparatus 100 includes a substrate 101 in which a pixel region P is defined, a thin film transistor (TFT), a planarization pattern 109, and an organic light-emitting device 114. The organic light-emitting device 114 includes a first electrode 111, a second electrode 113, and an intermediate layer 112. The TFT includes an active layer 103, a gate electrode 105, a source electrode 107, and a drain electrode 108.

Hereinafter, each member will be described in detail.

The pixel region P is defined in the substrate 101. The pixel region P is where visible light is realized, and it overlaps the intermediate layer 112.

The substrate 101 may be formed of a transparent glass material, mainly including $SiO_2$. However, the present invention is not limited thereto, and thus the substrate 101 may be formed of a transparent plastic material. In this case, the plastic material for forming the substrate 101 may be an insulating organic material selected from the group consisting of polyethersulphone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulous triacetate (TAC), and cellulose acetate propionate (CAP).

An optical resonance insulating layer 102 is formed on the substrate 101. The optical resonance insulating layer 102 may include $SiO_2$ or $SiN_x$. A part of light emitted from the intermediate layer 112 is reflected by an upper surface of the optical resonance insulating layer 102 toward the intermediate layer 112, and the reflected light is reflected again by the second electrode 113. Thus, optical resonance occurs in a space between the upper surface of the optical resonance insulating layer 102 and the second electrode 113. In addition, apart of the light emitted from the intermediate layer 112 is also reflected by a lower surface of the optical resonance insulating layer 102, that is, by a surface where the optical resonance insulating layer 102 contacts the substrate 101. Thus, optical resonance occurs in a space between the lower surface of the optical resonance insulating layer 102 and the second electrode 113. However, the present invention is not limited thereto, and the light emitted from the intermediate layer 112 generates optical resonance in a space between two interfaces from among the interfaces between two members selected from the group consisting of the substrate 101, the optical resonance insulating layer 102, the first electrode 111, the intermediate layer 112, and the second electrode 113.

In addition, the optical resonance insulating layer 102 may have a structure in which a plurality of layers are stacked. That is, the optical resonance insulating layer 102 may be formed by alternately stacking two materials having different refractive indices. For example, the optical resonance insulating layer 102 may be formed by alternately stacking a layer including $SiO_2$ and a layer including $SiN_x$ at least once. When the optical resonance insulating layer 102 has a structure in which a plurality of layers are stacked, each interface between the layers may function as a surface at which the light emitted from the intermediate layer 112 is reflected.

In addition, the optical resonance insulating layer 102 provides a flat surface on top of the substrate 101 and prevents moisture and foreign substances from penetrating into the substrate 101.

The optical resonance insulating layer 102 may be formed on the entire substrate 101.

The TFT is formed on the optical resonance insulating layer 102. The TFT is formed so as to be spaced apart from the pixel region P.

The active layer 103 having a predetermined pattern is formed on the optical resonance insulating layer 102. The active layer 103 may be formed of an inorganic semiconductor, such as amorphous silicon or polysilicon, or an organic semiconductor, and may include a source region, a drain region, and a channel region. A gate insulating film 104 is formed on the active layer 103. The gate insulating film 104 is formed so as to be spaced apart from the pixel region P. The gate insulating film 104 is covered by the planarization pattern 109 within an area where the planarization pattern 109 is formed.

The gate electrode 105 is formed in a predetermined region on the gate insulating film 104. The gate electrode 105 is connected to a gate line (not shown) for applying an ON/OFF signal to the TFT. The gate electrode 105 may be formed of a metal, such as Au, Ag, Cu, Ni, Pt, Pd, Al, or Mo, or an alloy, such as Al:Nd or Mo:W, but the present invention is not limited thereto.

An interlayer insulating film 106 is formed on the gate electrode 105 so as to expose the source and drain regions of the active layer 103. The source electrode 107 and the drain electrode 108 are formed so as to contact the exposed source region and the exposed drain region, respectively, of the active layer 103.

The interlayer insulating film 106 is spaced apart from the pixel region P and is covered by the planarization pattern 109 within an area where the planarization pattern 109 is formed. The interlayer insulating film 106 also has the same pattern as the gate insulating film 104. The patterns of the interlayer insulating film 106 and the gate insulating film 104 may be formed by performing a patterning process once. Thus, an outer surface of the interlayer insulating film 106 and an outer surface of the gate insulating film 104 may be positioned on the same plane. However, the present invention is not limited thereto, and thus the interlayer insulating film 106 and the gate insulating film 104 may be individually patterned.

The planarization pattern 109 is formed so as to cover the TFT and so as to be spaced apart from the pixel region P.

The planarization pattern 109 may be formed so as to have a thickness of more than 5000 Å in order to protect and insulate the TFT.

The planarization pattern 109 may also be formed so as to have a thickness of less than 2 µm in order to improve a patterning characteristic of the intermediate layer 112.

The first electrode 111 is formed on the planarization pattern 109. In detail, the planarization pattern 109 is formed so as to expose the drain electrode 108, and the first electrode 111 is connected to the exposed drain electrode 108. The first electrode 111 also extends so as to correspond to the pixel region P.

A pixel-defining layer 110 is formed on the first electrode 111. The pixel-defining layer 110 includes various insulating materials and is formed so as to expose a predetermined region of the first electrode 111. In detail, the pixel-defining layer 110 may be formed so as not to overlap the pixel region P. Thus, in the first electrode 111, a region corresponding to the pixel region P is not covered by the pixel-defining layer 110.

The pixel-defining layer 110 is formed so as to be thinner than the planarization pattern 109. Grooves may be formed in a surface of the pixel-defining layer 110 so as to correspond to grooves formed below the pixel-defining layer 110 by forming the pixel-defining layer 110 relatively thin. The pixel-defining layer 110 is formed thin so as to facilitate patterning of the intermediate layer 112. That is, the intermediate layer 112 may be exactly formed in a desired position by minimizing a difference in level between the pixel region P where the intermediate layer 112 is formed and an adjacent region.

In addition, the pixel-defining layer 110 is formed so as to have a thickness of more than 500 Å. When the pixel-defining layer 110 has a thickness of less than 500 Å, a problem of leakage current occurs in the organic light-emitting display apparatus 100, and thus the pixel-defining layer 110 may be formed so as to have a thickness of more than 500 Å.

The pixel-defining layer 110 includes a projecting portion 110a. The projecting portion 110a projects in a direction perpendicular to a thickness direction of the substrate 101. That is, the projecting portion 110a projects toward the pixel region P from a side of the planarization pattern 109. Also, the projecting portion 110a may be formed around the pixel region P.

The intermediate layer 112 is formed on the first electrode 111. In detail, the intermediate layer 112 is formed so as to contact at least a region of the first electrode 111 corresponding to the pixel region P. The intermediate layer 112 includes an organic emission layer (not shown). The intermediate layer 112 may be formed by using any of various methods, for example, a printing method. As described above, the pixel-defining layer 110 is formed relatively thin so that a difference in level between the region where the intermediate layer 112 is to be formed and the other regions is reduced. Accordingly, the patterning of the intermediate layer 112 may be easily performed.

In addition, the intermediate layer 112 may be easily patterned so as to exactly correspond to the pixel region P due to the projecting portion 110a of the pixel-defining layer 110.

In particular, when the intermediate layer 112 is formed by using a printing method, the projecting portion 110a may prevent a material for forming the intermediate layer 112 from being disposed in an undesired region, that is, in portions corresponding to the side surfaces of the planarization pattern 109 adjacent to the pixel region P. Thus, the intermediate layer 112 may be easily disposed in the pixel region P. The intermediate layer 112 is formed so as to contact side surfaces of the projecting portion 110a.

In FIG. 1, the intermediate layer 112 is formed only on the side surfaces of the projecting portion 110a, but the present invention is not limited thereto. That is, the intermediate layer 112 may also be formed on an upper surface of the projecting portion 110a.

The second electrode 113 is formed on the intermediate layer 112. When a voltage is applied through the first electrode 111 and the second electrode 113, visible light is produced by the organic emission layer of the intermediate layer 112.

A sealing member (not shown) may be disposed on the second electrode 113. The sealing member may be formed so as to protect the intermediate layer 112 and other layers from external moisture or oxygen. The sealing member may be formed of a transparent material, such as a transparent glass or plastic, and the sealing member may be formed so as to have a structure in which an organic material and an inorganic material are stacked.

The organic light-emitting display apparatus 100 of the current embodiment includes the optical resonance insulating layer 102 corresponding to at least the pixel region P. A part of the light emitted from the intermediate layer 112 is reflected by an upper surface or a lower surface of the optical resonance insulating layer 102. Thus, optical resonance occurs in a space between the upper surface of the optical resonance insulating layer 102 and the second electrode 113, and in a space between the lower surface of the optical resonance insulating layer 102 and the second electrode 113. The optical resonance also occurs in a space between the optical resonance insulating layer 102 and the intermediate layer 112. Light amplified due to the optical resonance is extracted from the organic light-emitting display apparatus 100, and thus luminescent efficiency is improved, and consequently image quality is increased.

The organic light-emitting display apparatus 100 of the current embodiment may have a structure in which light is extracted toward a rear surface of the organic light-emitting display apparatus 100, that is, toward the substrate 101. The TFT is disposed so as to be spaced apart from the pixel region P from which the light is extracted, and the planarization pattern 109 covering the TFT is formed so as to be spaced apart from the pixel region P. Thus, optical resonance easily occurs in a space between the optical resonance insulating layer 102 and the intermediate layer 112 without being interfered with by the planarization pattern 109 and the TFT, thereby improving image quality of the organic light-emitting display apparatus 100.

In addition, the pixel-defining layer 110 may be formed thin so that the intermediate layer 112 may be exactly disposed in a desired position. In particular, the intermediate layer 112 may be formed so as to completely fill a space where the intermediate layer 112 is to be formed. Thus, image quality of the organic light-emitting display apparatus 100 is improved.

In addition, the projecting portion 110a of the pixel-defining layer 110 prevents the intermediate layer 112 from being disposed in an undesired position, and thus the intermediate layer 112 may be uniformly formed in the entirety of the pixel region P, thereby realizing the organic light-emitting display apparatus 100 having uniform and improved image quality.

Figure 2:
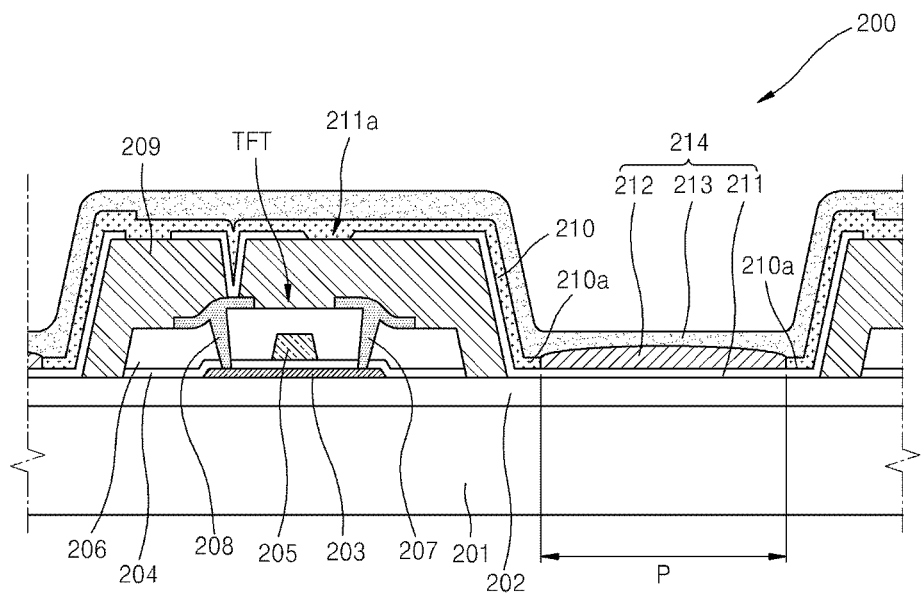
FIG. 2 is a schematic cross-sectional view of an organic light-emitting display apparatus according to another embodiment of the present invention.

FIG. 2 is a schematic cross-sectional view of an organic light-emitting display apparatus 200 according to another embodiment of the present invention.

Referring to FIG. 2, the organic light-emitting display apparatus 200 includes a substrate 201 in which a pixel region P is defined, a TFT, a planarization pattern 209, and an organic light-emitting device 214. The organic light-emitting device 214 includes a first electrode 211, a second electrode 213, and an intermediate layer 212. The TFT includes an active layer 203, a gate electrode 205, a source electrode 207, and a drain electrode 208.

Hereinafter, each member will be described in detail.

The pixel region P is defined in the substrate 201. The pixel region P is where visible light is realized, and it overlaps at least the intermediate layer 212.

An optical resonance insulating layer 202 is formed on the substrate 201. The optical resonance insulating layer 202 may include $SiO_2$ or $SiN_X$. A part of light emitted from the intermediate layer 212 is reflected by an upper surface of the optical resonance insulating layer 202 toward the intermediate layer 212, and the reflected light is reflected again by the second electrode 213. Thus, optical resonance occurs in a space between the upper surface of the optical resonance insulating layer 202 and the second electrode 214. In addition, a part of the light emitted from the intermediate layer 212 is reflected by a lower surface of the optical resonance insulating layer 202, that is, by a surface where the optical resonance insulating layer 202 contacts the substrate 201. Thus, optical resonance occurs in a space between the lower surface of the optical resonance insulating layer 202 and the second electrode 214. However, the present invention is not limited thereto, and the light emitted from the intermediate layer 212 generates optical resonance in a space between two interfaces from among the interfaces between two members selected from the group consisting of the substrate 201, the optical resonance insulating layer 202, the first electrode 211, the intermediate layer 212, and the second electrode 213.

The optical resonance insulating layer 202 may have a structure in which a plurality of layers are stacked. That is, the optical resonance insulating layer 202 may be formed by alternately stacking two materials having different refractive indices. For example, the optical resonance insulating layer 202 may be formed by alternately stacking a layer including $SiO_2$ and a layer including $SiN_X$ at least once. When the optical resonance insulating layer 202 has a structure in which a plurality of layers are stacked, each interface between the layers may function as a surface at which the light emitted from the intermediate layer 212 is reflected.

In addition, the optical resonance insulating layer 202 provides a flat surface on top of the substrate 201, and prevents moisture and foreign substances from penetrating into the substrate 201.

The optical resonance insulating layer 202 may be formed on the entire substrate 201.

The TFT is formed on the optical resonance insulating layer 202. The TFT is formed so as to be spaced apart from the pixel region P.

The active layer 203 having a predetermined pattern is formed on the optical resonance insulating layer 202. A gate insulating film 204 is formed on the active layer 203 so as to be spaced apart from the pixel region P. The gate insulating film 204 is covered by the planarization pattern 209 within an area where the planarization pattern 209 is formed.

The gate electrode 205 is formed in a predetermined region on the gate insulating film 204. The gate electrode 205 is connected to a gate line (not shown) for applying an ON/OFF signal to the TFT. The gate electrode 205 may be formed of a metal, such as Au, Ag, Cu, Ni, Pt, Pd, Al, or Mo, or an alloy, such as Al:Nd or Mo: W, but the present invention is not limited thereto.

An interlayer insulating film 206 is formed on the gate electrode 205 so as to expose the source and drain regions of the active layer 203. The source electrode 207 and the drain electrode 208 are formed to contact the exposed source region and the exposed drain region, respectively, of the active layer 203.

The interlayer insulating film 206 is spaced apart from the pixel region P and is covered by the planarization pattern 209 within an area where the planarization pattern 209 is formed. The interlayer insulating film 206 also has the same pattern as the gate insulating film 204. The patterns of the interlayer insulating film 206 and the gate insulating film 204 may be formed by performing a patterning process once. Thus, an outer surface of the interlayer insulating film 206 and an outer surface of the gate insulating film 204 may be positioned on the same plane.

The planarization pattern 209 is formed so as to cover the TFT and so as to be spaced apart from the pixel region P.

The planarization pattern 209 may be formed so as to have a thickness of more than 5000 Å in order to protect and insulate the TFT. The planarization pattern 209 may also be formed to have a thickness of less than 2 μm in order to improve a patterning characteristic of the intermediate layer 212.

The first electrode 211 is formed on the planarization pattern 209. In detail, the planarization pattern 209 is formed so as to expose the drain electrode 208, and the first electrode 211 is connected to the exposed drain electrode 208. The first electrode 211 also extends so as to correspond to the pixel region P. The first electrode 211 includes openings 211a through which the planarization pattern 209 is exposed. A high temperature process may be performed after forming the planarization pattern 209. For example, the high temperature process may be performed when the intermediate layer 212 is formed by using a printing method. At this time, gas generated by the planarization pattern 209 may be easily discharged through the openings 211a.

A pixel-defining layer 210 is formed on the first electrode 211. The pixel-defining layer 210 includes various insulating materials and is formed so as to expose a predetermined region of the first electrode 211. In detail, the pixel-defining layer 210 may be formed so as not to overlap the pixel region P. Thus, in first electrode 211, a region corresponding to the pixel region P is not covered by the pixel-defining layer 210.

The pixel-defining layer 210 is formed so as to be thinner than the planarization pattern 209. Grooves may be formed in a surface of the pixel-defining layer 210 so as to correspond to grooves formed below the pixel-defining layer 210 by forming the pixel-defining layer 210 relatively thin. The pixel-defining layer 210 is formed thin so as to facilitate patterning of the intermediate layer 212.

In addition, the pixel-defining layer 210 is formed so as to have a thickness of more than 500 Å. When the pixel-defining layer 210 has a thickness of less than 500 Å, a problem of leakage current occurs in the organic light-emitting display apparatus 200, and thus the pixel-defining layer 210 may be formed so as to have a thickness of more than 500 Å.

The pixel-defining layer 210 includes a projecting portion 210a. The projecting portion 210a projects in a direction perpendicular to a thickness direction of the substrate 201. That is, the projecting portion 210a projects toward the pixel region P from a side of the planarization pattern 209. Also, the projecting portion 210a may be formed around the pixel region P.

The intermediate layer 212 is formed on the first electrode 211. In detail, the intermediate layer 212 is formed so as to contact at least a region of the first electrode 211 corresponding to the pixel region P. The intermediate layer 212 includes an organic emission layer (not shown). The intermediate layer 212 may be formed by using any of various methods, for example, a printing method. As described above, the pixel-defining layer 210 is formed relatively thin so that a difference in level between the region where the intermediate layer 212 is to be formed and the other regions is reduced. Accordingly, the patterning of the intermediate layer 212 may be easily performed.

In addition, the intermediate layer 212 may be easily patterned so as to exactly correspond to the pixel region P due to the projecting portion 210a of the pixel-defining layer 210.

In particular, when the intermediate layer 212 is formed by using a printing method, the projecting portion 210a may prevent a material for forming the intermediate layer 212 from being disposed in an undesired region, that is, in portions corresponding to the side surfaces of the planarization pattern 209 adjacent to the pixel region P. Thus, the intermediate layer 212 may be easily disposed in the pixel region P. The intermediate layer 212 is formed so as to contact side surfaces of the projecting portion 210a.

In FIG. 2, the intermediate layer 212 is formed only on the side surfaces of the projecting portion 210a, but the present invention is not limited thereto. That is, the intermediate layer 212 may also be formed on an upper surface of the projecting portion 210a.

The second electrode 213 is formed on the intermediate layer 212. When a voltage is applied through the first electrode 211 and the second electrode 213, visible light is produced by the organic emission layer of the intermediate layer 212.

A sealing member (not shown) may be disposed on the second electrode 213. The sealing member may be formed so as to protect the intermediate layer 212 and other layers from external moisture or oxygen. The sealing member may be formed of a transparent material, such as a transparent glass or plastic, and the sealing member may be formed so as to have a structure in which an organic material and an inorganic material are stacked at least once.

The organic light-emitting display apparatus 200 of the current embodiment includes the optical resonance insulating layer 202 corresponding to at least the pixel region P. Light amplified due to the optical resonance is extracted from the organic light-emitting display apparatus 200, and thus luminescent efficiency is improved, and consequently, image quality is increased.

The organic light-emitting display apparatus 200 of the current embodiment may have a structure in which light is extracted toward a rear surface of the organic light-emitting display apparatus 200, that is, toward the substrate 201. The TFT is disposed so as to be spaced apart from the pixel region P from which the light is extracted, and the planarization pattern 209 covering the TFT is formed so as to be spaced apart from the pixel region P. Thus, optical resonance easily occurs in a space between the optical resonance insulating layer 202 and the intermediate layer 212 without being interfered with by the planarization pattern 209 and the TFT, thereby improving image quality of the organic light-emitting display apparatus 200.

In addition, the pixel-defining layer 210 may be formed thin so that the intermediate layer 212 may be exactly disposed in a desired position. In particular, the intermediate layer 212 may be formed so as to completely fill a space where the intermediate layer 212 is to be formed. Thus, image quality of the organic light-emitting display apparatus 200 is improved.

In addition, the projecting portion 210a of the pixel-defining layer 210 prevents the intermediate layer 212 from being disposed in an undesired position, and thus the intermediate layer 212 may be uniformly formed in the entirety of the pixel region P, thereby realizing the organic light-emitting display apparatus 200 having uniform and improved image quality.

In addition, openings 211a may be formed in the first electrode 211 so as to easily perform out-gassing in the planarization pattern 209 in a high temperature process, and thus the organic light-emitting display apparatus 200 may be prevented from deteriorating due to impure gas.

The organic light-emitting display apparatus according to the present invention may easily improve image quality.

While the present invention has been particularly shown, and described with reference to exemplary embodiments thereof, it will be understood by those of ordinary skill in the art that various changes in form and detail may be made therein without departing from the spirit and scope of the present invention as defined by the following claims.

What is claimed is:

1. An organic light-emitting display apparatus, comprising:
   a substrate in which a pixel region is defined;
   a thin film transistor (TFT) disposed on the substrate and spaced apart from the pixel region;
   a planarization pattern covering the TFT and spaced apart from the pixel region, the planarization pattern having an opening and sidewalls about the opening, the pixel region being arranged within the opening;
   a first electrode electrically connected to the TFT and formed so as to correspond to at least the pixel region, the first electrode being arranged on the planarization pattern and on sidewalls of the opening:
   a pixel-defining layer formed on the first electrode so as to expose a predetermined region of the first electrode, the pixel-defining layer having projecting portions extending inward towards the pixel region from a bottom of the sidewalls of the opening of the planarization pattern;
   an intermediate layer connected to the exposed region of the first electrode, said intermediate layer comprising an organic emission layer and formed so as to correspond to at least the pixel region; and
   a second electrode electrically connected to the intermediate layer.

2. The organic light-emitting display apparatus of claim 1, wherein the TFT comprises an active layer, a gate electrode insulated from the active layer, a source electrode, and a drain electrode, and wherein the first electrode is connected to the drain electrode.

3. The organic light-emitting display apparatus of claim 2, further comprising a gate insulating film disposed between the active layer and the gate electrode, and an interlayer insulating film disposed between the gate electrode and the source electrode, and between the gate electrode and the drain electrode; and
   wherein the gate insulating film and the interlayer insulating film are covered by the planarization pattern within an area where the planarization pattern is formed.

4. The organic light-emitting display apparatus of claim 2, wherein an outer surface of the gate insulating film and an outer surface of the interlayer insulating film are disposed on a same plane.

5. The organic light-emitting display apparatus of claim 1, wherein the projecting portions are arranged around the pixel region.

6. The organic light-emitting display apparatus of claim 5, wherein the projecting portions project in a direction perpendicular to a thickness direction of the substrate.

7. The organic light-emitting display apparatus of claim 5, wherein the intermediate layer contacts side surfaces of the projecting portions.

8. The organic light-emitting display apparatus of claim 1, wherein the pixel-defining layer is thinner than the planarization pattern.

9. An organic light-emitting display apparatus, comprising:
   a substrate in which a pixel region is defined;
   a thin film transistor (TFT) arranged on the substrate and spaced apart from the pixel region;
   a planarization pattern covering the TFT, the planarization pattern having an opening with sidewalls that are spaced apart from the pixel region;
   a first electrode electrically connected to the TFT and being arranged to correspond to at least the pixel region;
   a pixel-defining layer arranged on the first electrode and having an opening within the opening in the planarization pattern to expose a portion of the first electrode that corresponds to the pixel region;
   an intermediate layer being arranged only within the opening in the pixel-defining layer, the intermediate layer being connected to the exposed portion of the first electrode, said intermediate layer including an organic emission layer;
   a second electrode electrically connected to the intermediate layer, and
   an optical resonance insulating layer formed between the substrate and the first electrode in at least the pixel region.

10. The organic light-emitting display apparatus of claim 9, the intermediate layer being spaced-apart from portions of the pixel-defining layer that correspond to the sidewalls of the opening of the planarization layer.

11. The organic light-emitting display apparatus of claim 9, wherein the pixel-defining layer having a thickness of more than 500 Å and less than a thickness of the planarization pattern.

12. The organic light-emitting display apparatus of claim 9, the first electrode also being arranged on the sidewalls of the opening of the planarization pattern, the pixel-defining layer having projecting portions extending inward towards the pixel region from a bottom of the sidewalls of the opening of the planarization pattern.

13. The organic light-emitting display apparatus of claim 1, wherein the first electrode is formed on the planarization pattern and comprises openings external to the pixel area through which the planarization pattern is exposed.

14. The organic light-emitting display apparatus of claim 1, wherein the intermediate layer is formed by using a printing method.

15. The organic light-emitting display apparatus of claim 1, the projecting portions have a top surface covered by the second electrode, end surfaces covered by the intermediate layer and a lower surface covering the first electrode.

16. The organic light-emitting display apparatus of claim 1, wherein the intermediate pattern is entirely arranged within the opening of the planarization pattern and is absent from the sidewalls of the opening of the planarization pattern.

17. The organic light-emitting display apparatus of claim 1, wherein the pixel-defining layer is thinner than the planarization pattern.

18. An organic light-emitting display apparatus, comprising:
    a substrate in which a pixel region is defined;
    a thin film transistor (TFT) disposed on the substrate and spaced apart from the pixel region;
    a planarization pattern covering the TFT and forming an opening for the pixel region, the opening having sidewalls;
    a first electrode electrically connected to the TFT and arranged to correspond to at least the pixel region;
    a pixel-defining layer arranged on the sidewalls of the planarization pattern and exposing a region of the first electrode, the pixel defining layer also including projecting portions arranged on the first electrode at a location corresponding to the opening of the planarization pattern and adjacent to the sidewalls of the planarization pattern;
    an intermediate layer arranged on the exposed region of the first electrode, said intermediate layer comprising an organic emission layer and formed so as to correspond to at least the pixel region; and
    a second electrode electrically connected to the intermediate layer.

19. The organic light-emitting display apparatus of claim 18, wherein a thickness of the pixel defining layer is less than that of the planarization pattern.

20. The organic light-emitting display apparatus of claim 18, the intermediate layer being absent from the sidewalls of the planarization pattern.

* * * * *